(12) United States Patent
Kaikuranta et al.

(10) Patent No.: US 6,639,523 B2
(45) Date of Patent: Oct. 28, 2003

(54) RESISTIVE KEYBOARD WITH STATUS KEYS

(75) Inventors: Terho Kaikuranta, Piispanristi (FI); Bror Svarfvar, Kaarina (FI)

(73) Assignee: Nokia Corporation, Espoo (FI)

( * ) Notice: Subject to any disclaimer, the term of this patent is extended or adjusted under 35 U.S.C. 154(b) by 200 days.

(21) Appl. No.: 09/761,970

(22) Filed: Jan. 17, 2001

(65) Prior Publication Data

US 2002/0126096 A1 Sep. 12, 2002

(51) Int. Cl.[7] .............................................. H03M 11/00
(52) U.S. Cl. ............................. 341/22; 341/23; 341/26; 340/2.2; 340/2.27; 340/2.28; 345/168; 345/169; 345/172; 400/472; 400/476; 400/479
(58) Field of Search ................................. 345/168, 169, 345/172; 400/472, 476, 479; 341/22, 23, 26; 340/2.2, 2.28, 2.27

(56) References Cited

U.S. PATENT DOCUMENTS

| 4,918,634 | A | * | 4/1990 | Nishimori | ................... | 364/709 |
|---|---|---|---|---|---|---|
| 5,371,498 | A | * | 12/1994 | Kwon et al. | ................... | 341/24 |
| 5,521,575 | A | * | 5/1996 | Pack | ........................... | 341/26 |
| 5,619,196 | A | * | 4/1997 | Escobosa | ..................... | 341/22 |
| 5,826,992 | A | * | 10/1998 | Camacho et al. | ........... | 400/489 |
| 6,222,466 | B1 | * | 4/2001 | Uggmark | ..................... | 341/22 |
| 6,424,274 | B1 | * | 7/2002 | Schnizlein et al. | .......... | 341/26 |

* cited by examiner

*Primary Examiner*—Richard Hjerpe
*Assistant Examiner*—Jennifer T. Nguyen
(74) *Attorney, Agent, or Firm*—Ware, Fressola, Van Der Sluys & Adolphson LLP

(57) ABSTRACT

An arrangement of a plurality of status keys in a keyboard for entering information in an electronic device. The keyboard comprises a plurality of regular keys connected to a resistive strip at a plurality of locations for providing a first signal when one of the regular keys is pressed and the first signal is indicative of the location associated with the pressed regular key; a plurality of resistors, each having a different resistance, connected in series to the resistive strip, and separately connected in parallel to the status keys so that the resistors can be selectively by-passed by pressing one or more status keys, wherein a second signal is provided when one of the regular keys is pressed together with at least one status key, and wherein the second signal is indicative of the resistance the status key for identifying the pressed status key.

23 Claims, 11 Drawing Sheets

RESISTIVE KEYBOARD WITH STATUS KEYS

FIELD OF THE INVENTION

The present invention relates generally to a keyboard for entering information in an electronic device and, in particular, to a keyboard with status keys such as the ALT, CTRL, SHIFT keys in addition to the alphanumeric keys.

BACKGROUND OF THE INVENTION

It is known that when a plurality of on-off switches SW1, SW2 and SW3 are connected to a series of resistors R1, R2, R3 and R4, as shown in FIG. 1a, it is possible to identify which one of the switches is closed by measuring the resistance $r_1$ between point A and point B and the resistance $r_2$ between point B and point C, and calculating the ratio $r_2/r_1$, For example, if SW3 is closed while SW2 and SW1 are open, the ratio is given by $r_2/r_1 = R4/(R1+R2+R3)$. Similarly, if SW2 is closed while SW1 and SW3 are open, the ratio is given by $r_2/r_1 = (R3+R4)/(R1+R2)$. In particular, if point C is connected to circuit ground G and point A is connected to a power source having a known voltage V relative to the ground G, as shown in FIG. 1b, it is sufficient to measure the voltage $V_1$ at point B in reference to V, or the voltage $V_2$ at point B in reference to the ground G. As shown in FIGS. 1a and 1b, the switches SW1, SW2 and SW3 are connected to the series of resistors R1–R4 at different locations J1, J2 and J3. Thus, it is possible to find out the location at which the switch is closed from the measured voltage V1 or V2. Alternatively, it is possible to measure the current I drawn through the resistors R1, R2, . . . by measuring the electrical potential or voltage between point V and point Vr, which is the voltage across a reference resistor Rr, as shown in FIG. 1c. From the known current I, it is sufficient to measure either V1 or V2 to identify the closed switch and the associated location.

The potentiometer-like arrangement, as shown in FIGS. 1a–1c, can be used to construct a keyboard for entering information in an electronic device. For example, the switches SW1, SW2, . . . can be used as the number keys representing numerals 1, 2, . . . in a telephone keyboard for dialing.

In a circuit board, it is possible to build a keyboard using discrete resistors by electrically connecting the connectors of each discrete resistor to a printed circuit, for example. It is also possible to print a thick-film material directly onto the circuit board to form the series of resistors. It is further possible to use a single resistive strip R, as shown in FIG. 2a, to replace the series of discrete resistors R1, R2, . . . , in a keyboard arrangement, or two resistive strips R and R', as shown in FIG. 2b, to replace the series of discrete resistors. Resistive keyboards, as shown in FIGS. 2a and 2b, are compact, rugged and cost-effective. The number of I/O pins in a resistive keyboard, in general, is much smaller than that in a regular keyboard. A reduced number of I/O pins is especially beneficial in a hand-held electronic device such as a Nokia Communicator, which has 64 keys.

It is advantageous and desirable to improve the resistive keyboard to include status keys such as the ALT, SHIFT and CTRL keys for changing the meaning or function of other keys as in a QWERTY keyboard, while keeping the number of I/O pins small.

SUMMARY OF THE INVENTION

It is the primary objective of the present invention to provide a keyboard with status keys for changing the meaning or function of other keys in the keyboard by pressing one or more status keys when at least one of the other keys is pressed, wherein the status keys are separately connected to a series of resistors, each having a different resistance to identify the pressed status key.

According to the first aspect of the present invention, a keyboard for entering information in an electronic device comprising a plurality of first keys electronically connected to a series of first resistors at a plurality of locations for providing a first signal when one of the first keys is pressed, wherein the first signal is indicative of the location of the pressed first key; a plurality of second resistors connected in series to the series of first resistors, wherein each second resistor has a different resistance; and a plurality of the second keys separately connected in parallel to the second resistors for selectively by-passing the second resistors when one or more second keys are pressed, wherein a second signal is provided when one of the first keys is pressed together with at least one second key, and wherein the second signal is indicative the resistance of the at least one pressed second key.

Preferably, the first resistors are provided in a form of one or more resistive strips.

Preferably, the first keys include alphanumeric keys, each representing a different alphanumeric value and the second keys include status keys for changing the alphanumeric value.

According to the second aspect of the present invention, a method of arranging a keyboard for entering information in an electronic device comprising the steps of providing a plurality of first resistors connected in series; providing a plurality of first keys electronically connected to the series of first resistors at a plurality of locations for providing a first signal when one of the first keys is pressed, wherein the first signal is indicative of the location of the pressed first key; providing a plurality of second resistors connected in series to the series of first resistors, wherein each second resistor has a different resistance; and providing a plurality of second keys separately connected in parallel to the second resistors for selectively by-passing the second resistors when one or more of the second keys are pressed, wherein a second signal is provided when one of the first keys is pressed together with at least one second key, and wherein the second signal is indicative of the location of the pressed first key and the resistance associated with the at least one pressed second key.

According to the third aspect of the present invention, an electronic device comprising a keyboard for entering information, wherein the keyboard comprises a plurality of first keys electronically connected to a series of first resistors at a plurality of locations for providing a first signal when one of the first keys is pressed, wherein the first signal is indicative of the location of the pressed first key; a plurality of second resistors connected in series to the series of first resistors, wherein each second resistor has a different resistance; and a plurality of second keys separately connected in parallel to the second resistors for selectively by-passing the second resistors when one or more second keys are pressed, wherein a second signal is provided when one of the first key is pressed together with at least one second key, and wherein the second signal is indicative of the resistance of the at least one pressed second key. The keyboard further comprises means, responsive to the first and second signal, for identifying the pressed first and second keys, and means for processing information based on the identified first and second keys.

The present invention will become apparent upon reading the description taken in conjunction with FIGS. 3 to 6c.

BEST MODE FOR CARRY OUT THE INVENTION

Figure 2A:
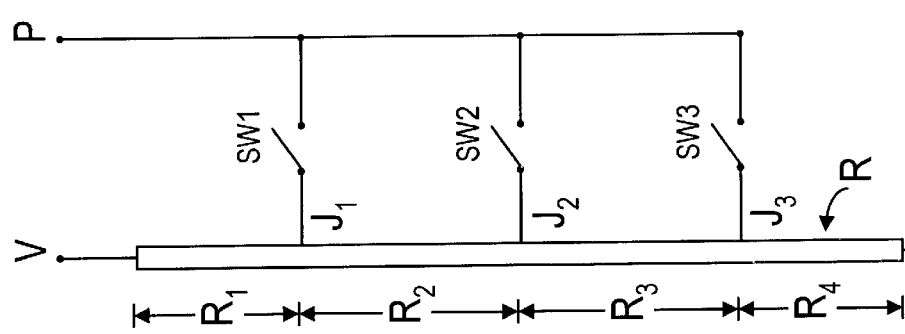
FIG. 2a is a diagrammatic representation illustrating the principle of identifying a closed switch in a circuit using a single resistive strip.
Figure 3:
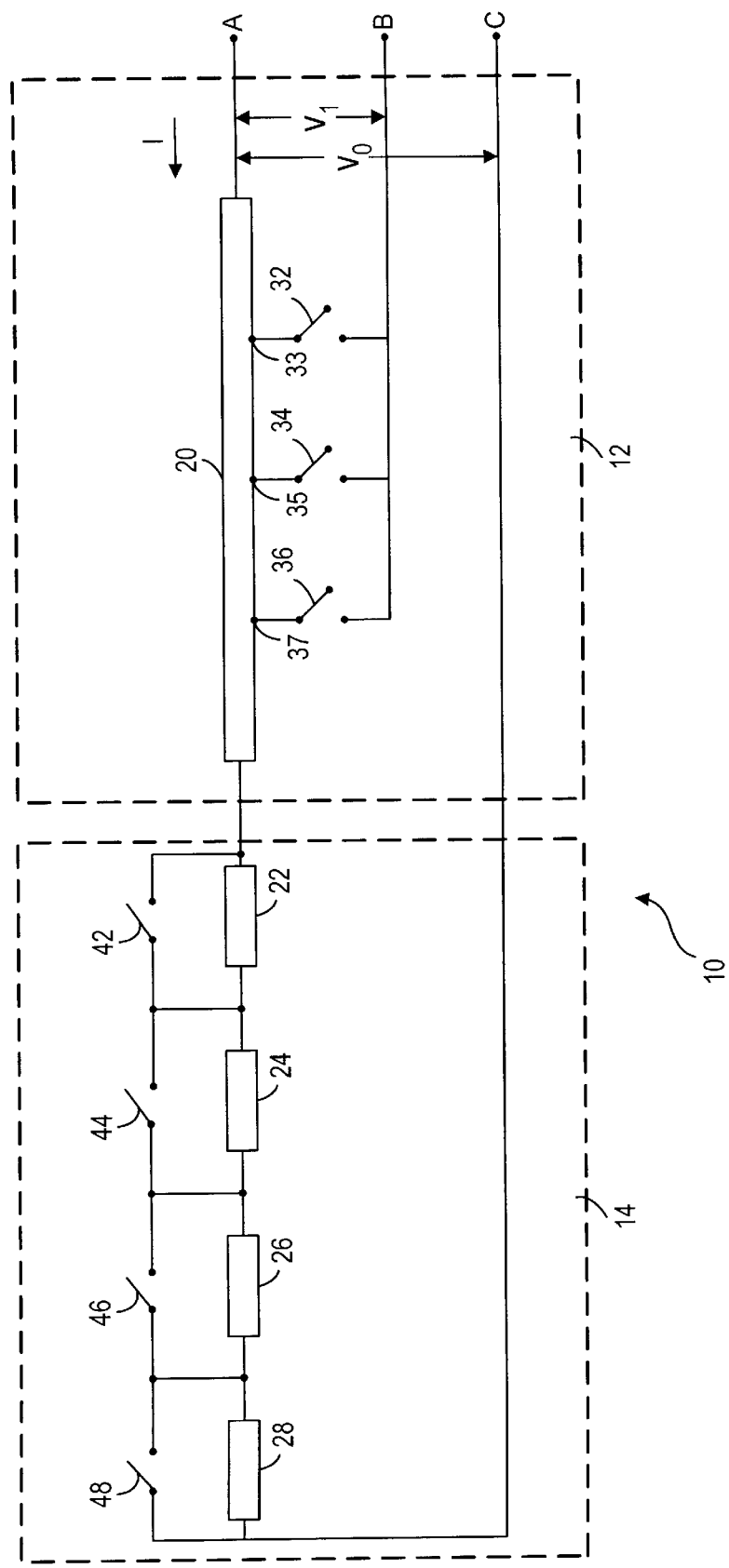
FIG. 3 is a diagrammatic representation illustrating the principle of serial arrangement of status keys in a keyboard, according to the present invention.

Referring to FIG. 3, a keyboard arrangement 10 has a first keyboard section 12 and a second keyboard section 14. The first keyboard section 12 has a resistive strip 20 and a plurality of first switches 32, 34, 36 connected to the resistive strip 20 at a plurality of locations 33, 35, 37. The first switches 32–36 are on-off switches and are further connected to a common point B for voltage or resistance measurement, in reference to point A. The second section 14 has a series of resistors 22–28. One end of the resistor series is connected to one end of the resistive strip 20 in the first section 12. The other end of the resistor series is connected to a point C for voltage or resistance measurement. A plurality of second switches 42–48 are separately connected in parallel to each of the resistors 22–28 for selectively by-passing the resistors when one or more of the second switches 42–48 are pressed. As with FIG. 2a, it is possible to identify which one of the first switches 32–36 is activated or pressed to operate at a closed position by measuring the voltage V1 across point A and point B and calculating the impedance between point A and point B from a known current I. This is equivalent to using an ohm-meter to measure the resistance between the same points. Likewise, it is possible to measure the total impedance between point A and point C by measuring the voltage V0 therebetween to determine whether any of the second switches 42–48 is pressed or activated. It is preferred that the first switches 32–36 are used as the alphanumeric keys and other function keys such as DEL, INSERT, END, HOME, and arrow keys of a QWERTY keyboard or the like. The second switches 42–48 are used as status keys such as the SHIFT, CTRL, and ALT keys for changing the meaning or function of the keys represented by the first switches 32–36. Because the switches are used as keys in the keyboard, the term "switch" and "key" are used interchangeably herein.

When one or more of the second switches 42–48 are pressed or activated, the activated second switches electrically by-pass the resistors connected thereto. Thus, when one of the first switches 32–36 is pressed or activated together with one or more second switches 42–48, the voltage V1 and voltage V0 are different from the measurement when none of the second switches 42–48 are pressed. With the measured V1 and V0, it is possible to identify which one of the first switches is pressed and which, if any, of the second switches are pressed, as illustrated in FIGS. 4a–4c.

Figure 4A:
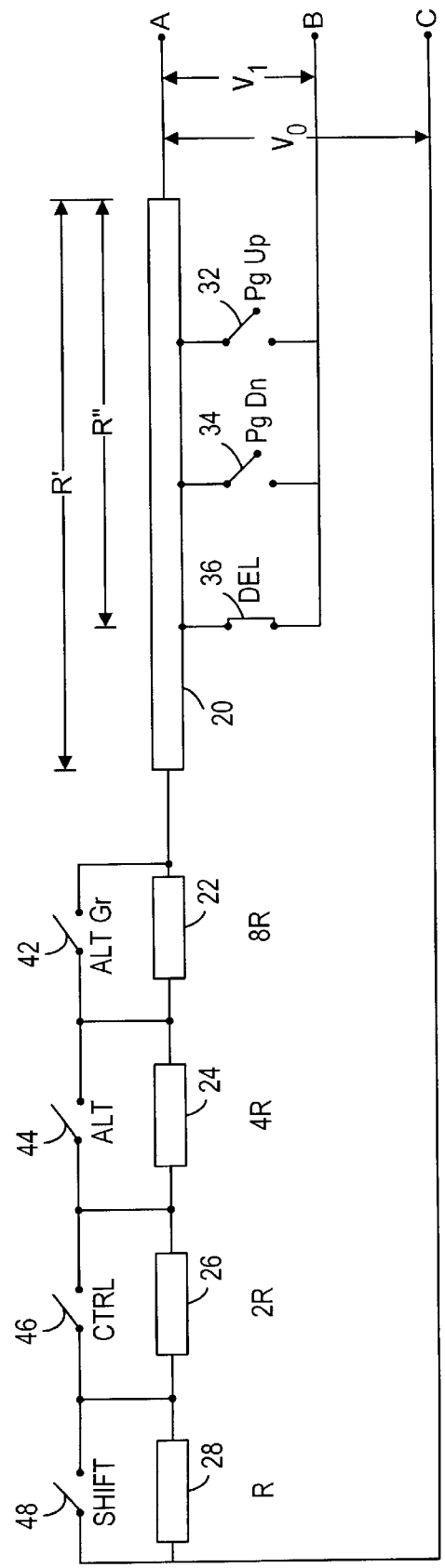
FIG. 4a is a diagrammatic representation illustrating the principle of identifying a closed key connected to a resistive strip when none of the status keys are pressed.

Referring to FIG. 4a, the first switches 32–36 represent the PgUp, PgDn and DEL key, and the second switches 42–48 represent the ALT Gr, ALT, CTRL and SHIFT keys, respectively. Preferably, the resistance of each of the resistors 22–28 is different from each other so as to identify the pressed second switches from the by-passed resistors. For example, the resistors 22–28 are chosen to have resistance of 8R, 4R, 2R and R. Accordingly, when the first switch 36 (the DEL key) is pressed but none of the second switches 42–48, the total impedance between point A and point C is equal to R'+15R. The impedance between point A and point B, however, is R" regardless of whether any one of the second switches 42–48 is pressed. Thus, it is possible to identify which first key and which second key or keys are pressed based on the measured impedance.

Figure 4B:
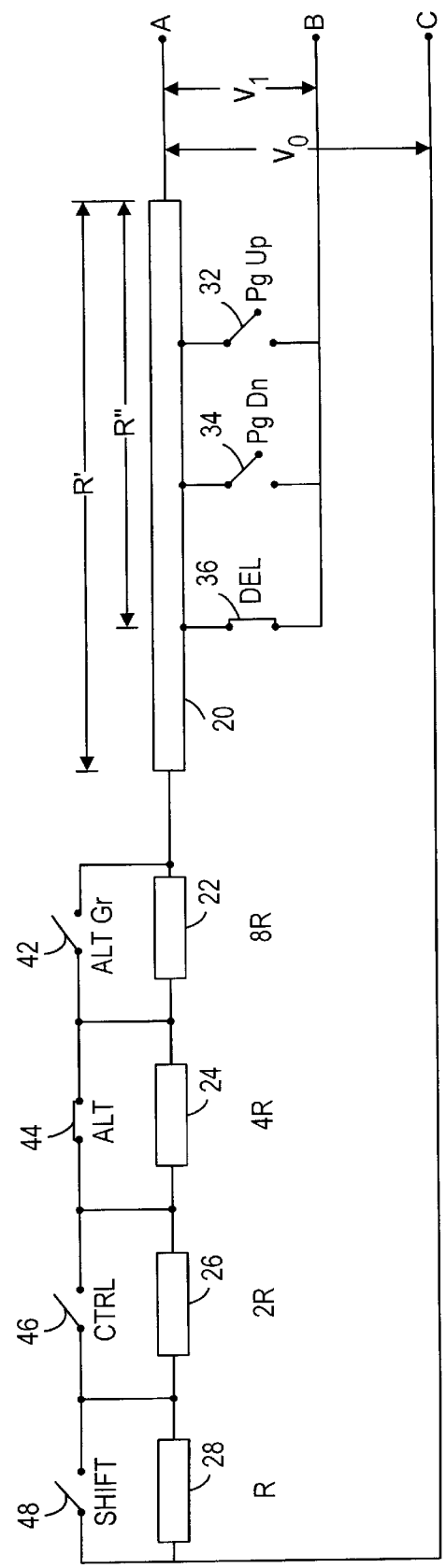
FIG. 4b is a diagrammatic representation illustrating the principle of identifying a closed key connected to a resistive strip when one of the status keys is pressed.

If the first switch 36 is pressed together with the second switch 44, as shown in FIG. 4b, the total impedance between point A and point C is equal to R'+11R. By subtracting R', which is known, from the total impedance, we have 11R. Using a look-up table or the like, it can be known that the second switches 44 (the ALT key) is pressed. Thus, from the measured values of the voltage V1 and voltage V0, it can be known that the key function is ALT+DEL.

Figure 4C:
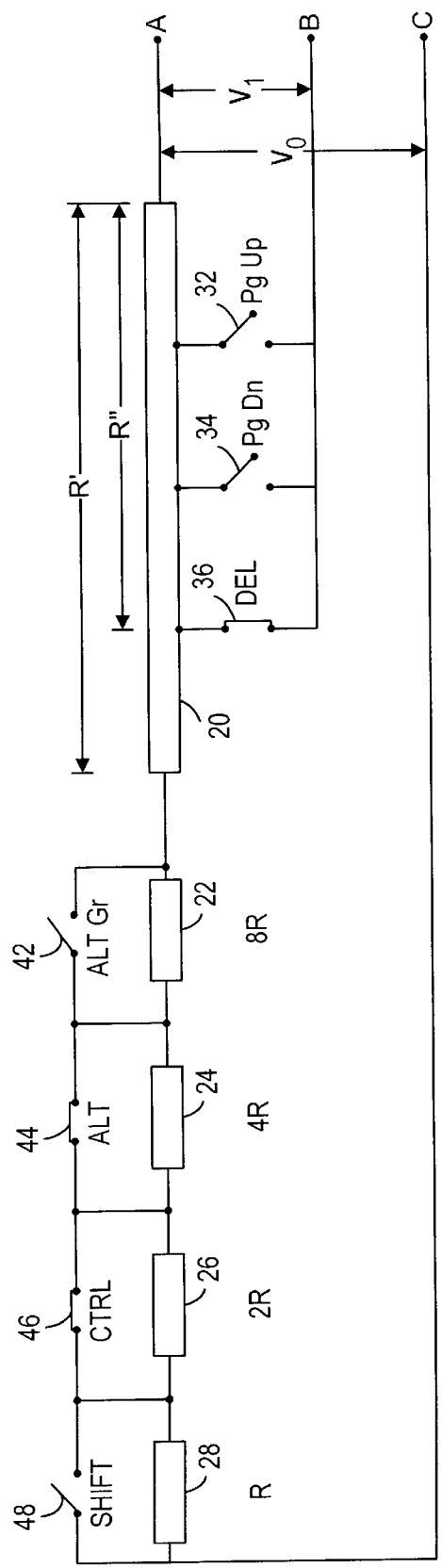
FIG. 4c is a diagrammatic representation illustrating the principle of identifying a closed key connected to a resistive strip when two of the status keys are pressed.

Likewise, if the first switch 36 is pressed together with the second switches 44 and 46, as shown in FIG. 4c, the total impedance between point A and point C is equal to R'+9R. By subtracting R' from the total impedance, we have 9R. In a similar manner, we know that the key function is now CTRL+ALT+DEL.

It is preferred that the status keys, as represented by the second switches 42–48 (FIGS. 4a–4c), and the combination of the status keys be assigned to a binary coded decimal (BCD) notation, as listed in Table I. This code assignment can be accomplished by using a look-up table or the like. From the assigned code, a signal processor can recognize which status keys are pressed together with the regular keys (first keys 32–36), and process the entered information via the pressed key. As can be seen from Table I, the practical section of resistor values does not necessarily follow the absolute "symmetry" of the BCD series. The main consideration in selecting the resistor values is that:

1. The total impedance R' of the resistive strip is lower than the smallest resistance value associated with the status keys (R, as shown in FIGS. 4a–4c); and
2. The resistance value associated with each status key must exceed the resistance sum of all smaller resistors (e.g., 4R associated with status key 44 is larger than R+2R associated with status keys 46 and 48), including the accumulated margin of error from manufacturing tolerances.

As a consequence, the steps between the resistance values at the lower end of the resistor series (between 2R and R, for example) are much smaller than the steps between the resistance values at the higher end (between 8R and 4R). But this may be necessary because it is essential that no misinterpretation of the input command occurs, regardless of which combination of keys is used.

TABLE 1

| Decimal | Binary | Impedance | Total |
| --- | --- | --- | --- |
| 0 | 0000 | 0 | 0 |
| 1 | 0001 | R | R |
| 2 | 0010 | 2R | 2R |
| 3 | 0011 | 2R + R | 3R |
| 4 | 0100 | 4R | 4R |
| 5 | 0101 | 4R + R | 5R |
| 6 | 0110 | 4R + 2R | 6R |
| 7 | 0111 | 4R + 2R + 1 | 7R |
| 8 | 1000 | 8R | 8R |
| 9 | 1001 | 8R + R | 9R |
| 10 | 1010 | 8R + 2R | 10R |
| 11 | 1011 | 8R + 2R + 2 | 11R |
| 12 | 1100 | 8R + 4R | 12R |
| 13 | 1101 | 8R + 4R + R | 13R |
| 14 | 1110 | 8R + 4R + 2R | 14R |
| 15 | 1111 | 8R + 4R + 2R + R | 15R |

Figure 5:
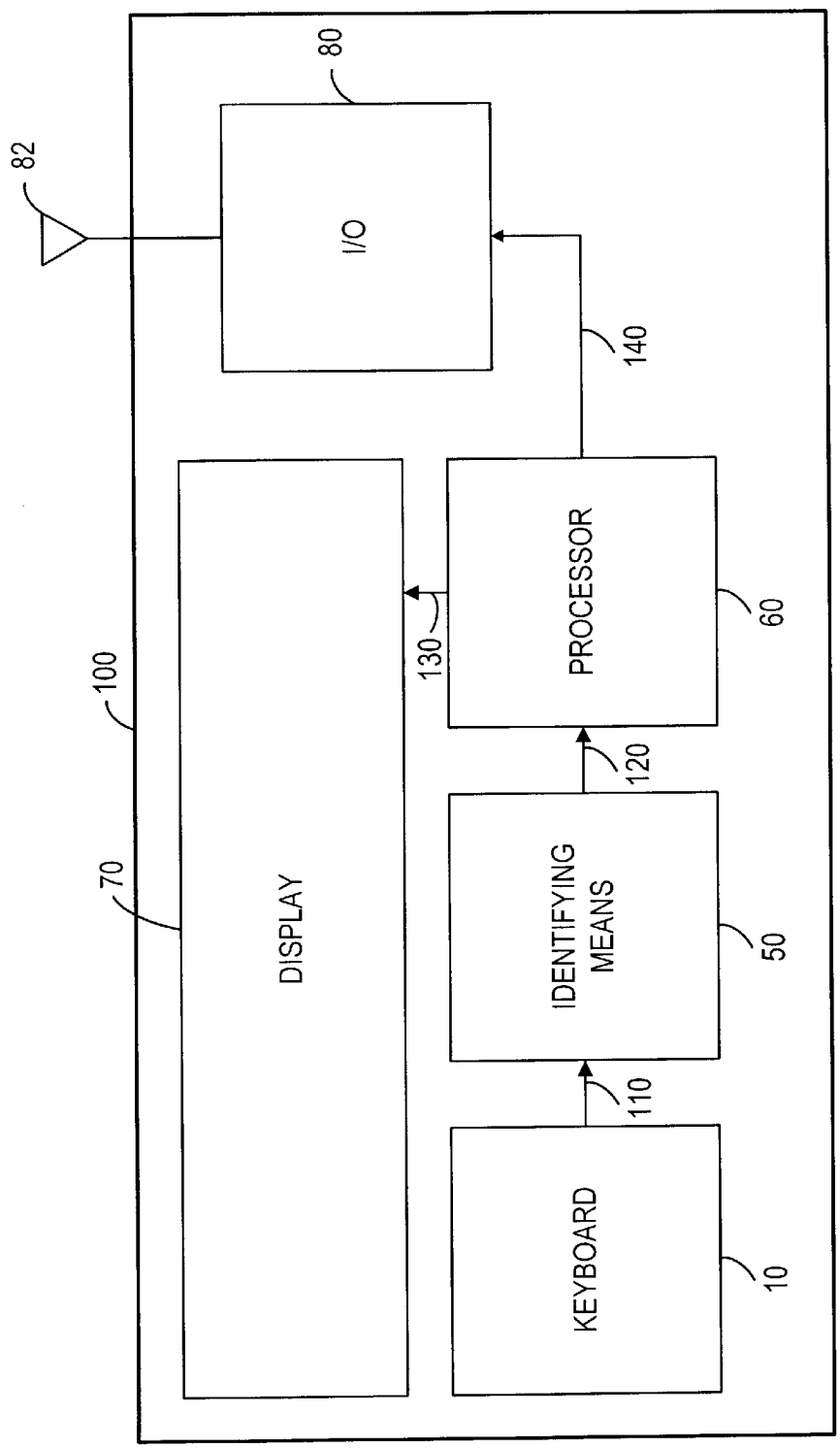
FIG. 5 is a block diagram illustrating an electronic device having a keyboard, according to the present invention.

The arrangement of status keys as an extension to a resistive keyboard of the present invention, as illustrated in FIGS. 4a–4c, can be used in an electronic device 100, as shown in FIG. 5. As shown, the electronic device 100 comprises the keyboard 10 of the present invention, which provides a signal 110 to an identifying means 50 when one or more first keys are pressed with or without the second keys being pressed. In response to the signal 110, the identifying means 50 identifies the pressed key or keys in the keyboard 10 by means of a look-up table or the like. The identifying means 50 further assigns a binary coded decimal notation, or other coded notation, to the pressed key or keys and then provides a signal 120 indicative of the coded notation to a signal/data processor 60. The processor 60, responsive to the signal 120, processes the information provided through the keyboard 10 or other components of the electronic device 100. The processor 60 may convey a signal 130 indicative of the processed information to a display unit 70 for display. If the electronic device 100 is a communications device, such as a telephone set or a communicator, the processor 60 may provide a signal 140 indicative of the processed information to an I/O device 80 so that the signal 140 can be conveyed to other communication devices (not shown) through an antenna 82. The I/O device 80 may include a transmitter and a receiver (not shown).

Figure 1B:
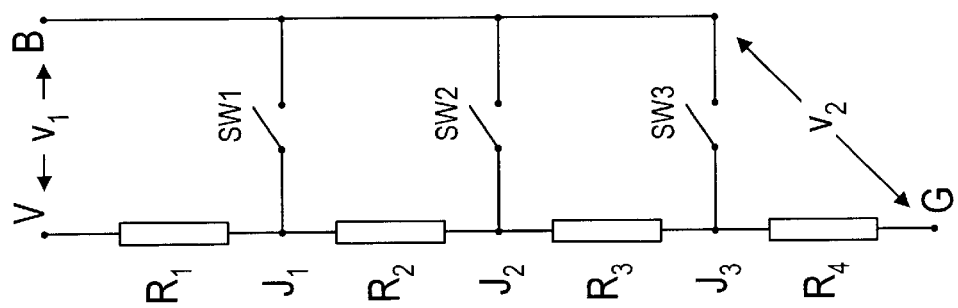
FIG. 1b is a diagrammatic representation illustrating the principle of identifying a closed switch in a circuit by measuring the voltage at various points in the circuit.
Figure 1A:
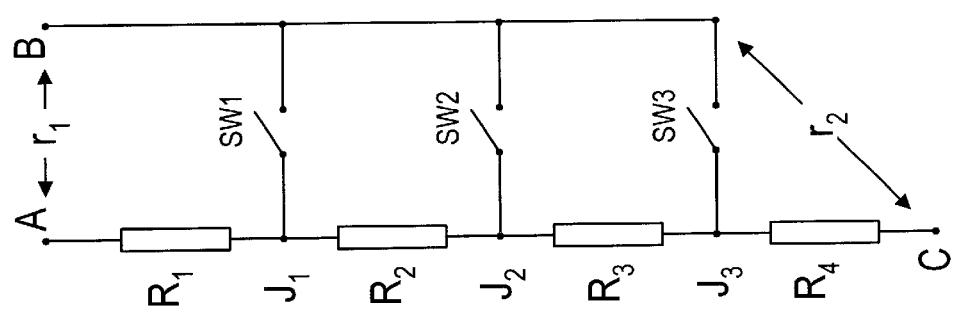
FIG. 1a is a diagrammatic representation illustrating the principle of identifying a closed switch in a circuit by measuring the resistors in the circuit.
Figure 1C:
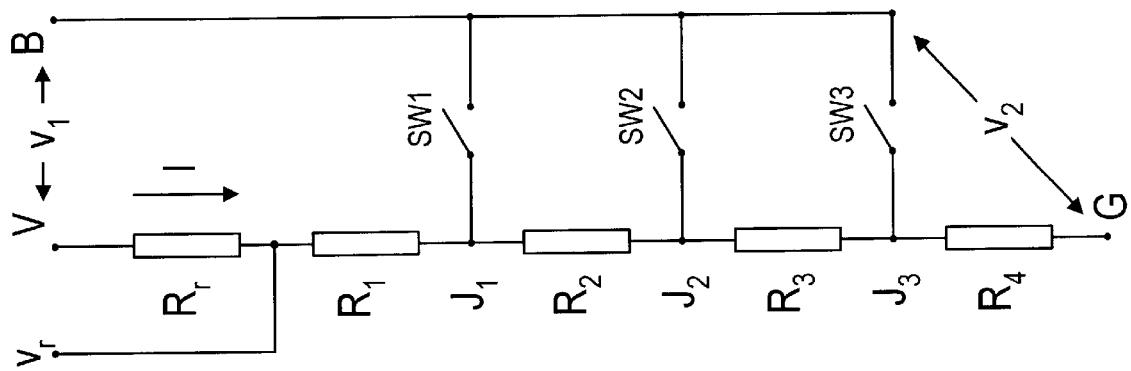
FIG. 1c is a diagrammatic representation illustrating the principle of identifying a closed switch in a circuit by measuring the voltage at a point in the circuit and the current drawn through the circuit.
Figure 2B:
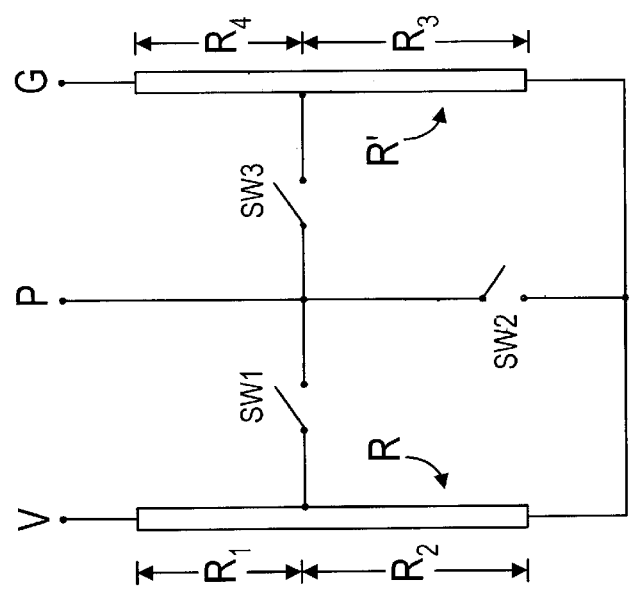
FIG. 2b is a diagrammatic representation illustrating the principle of identifying a closed switch in a circuit using two resistive strips.
Figure 6A:
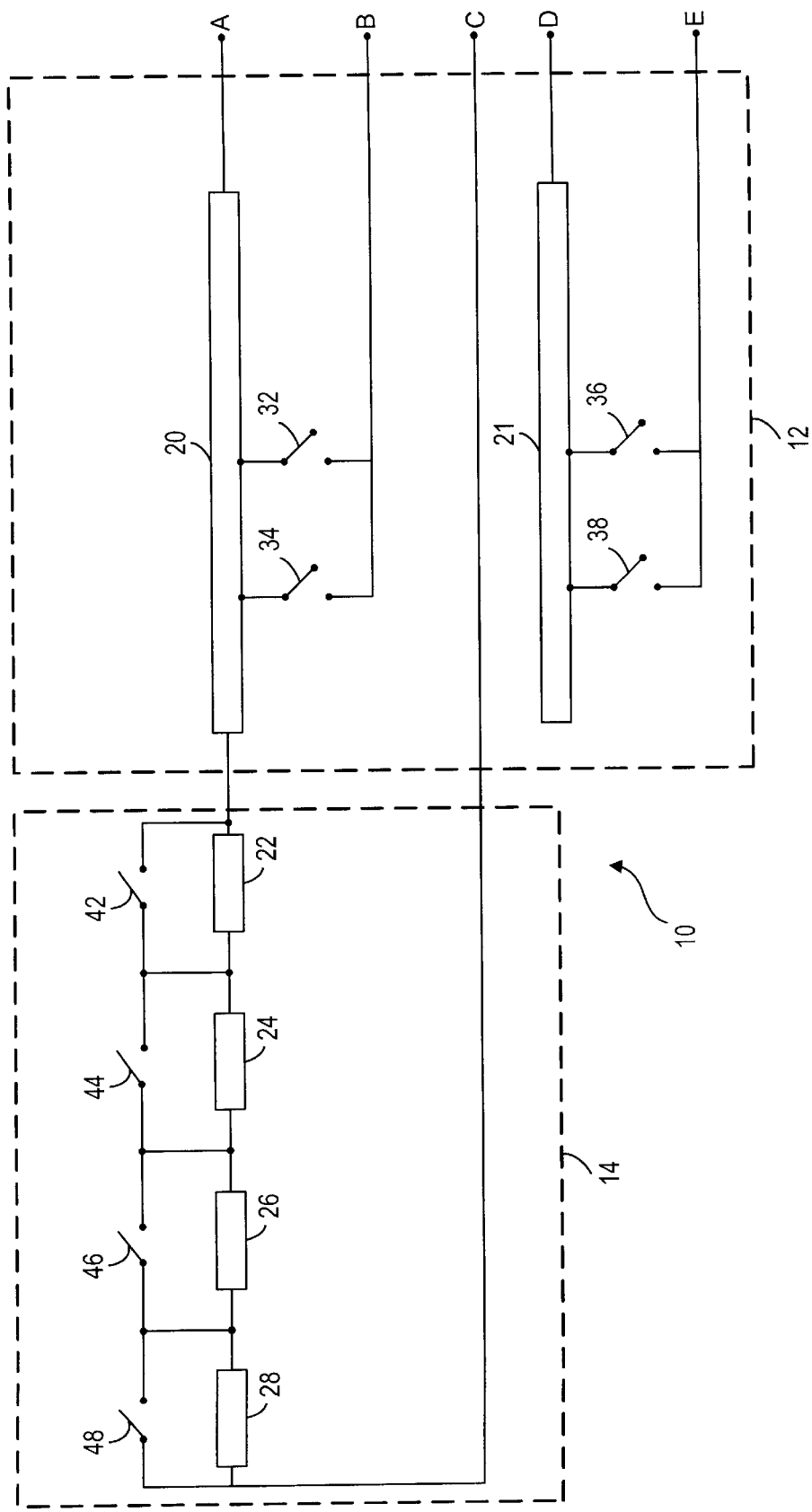
FIG. 6a is a diagrammatic representation illustrating more than one resistive strip being used in a keyboard having status keys, according to the present invention.
Figure 6B:
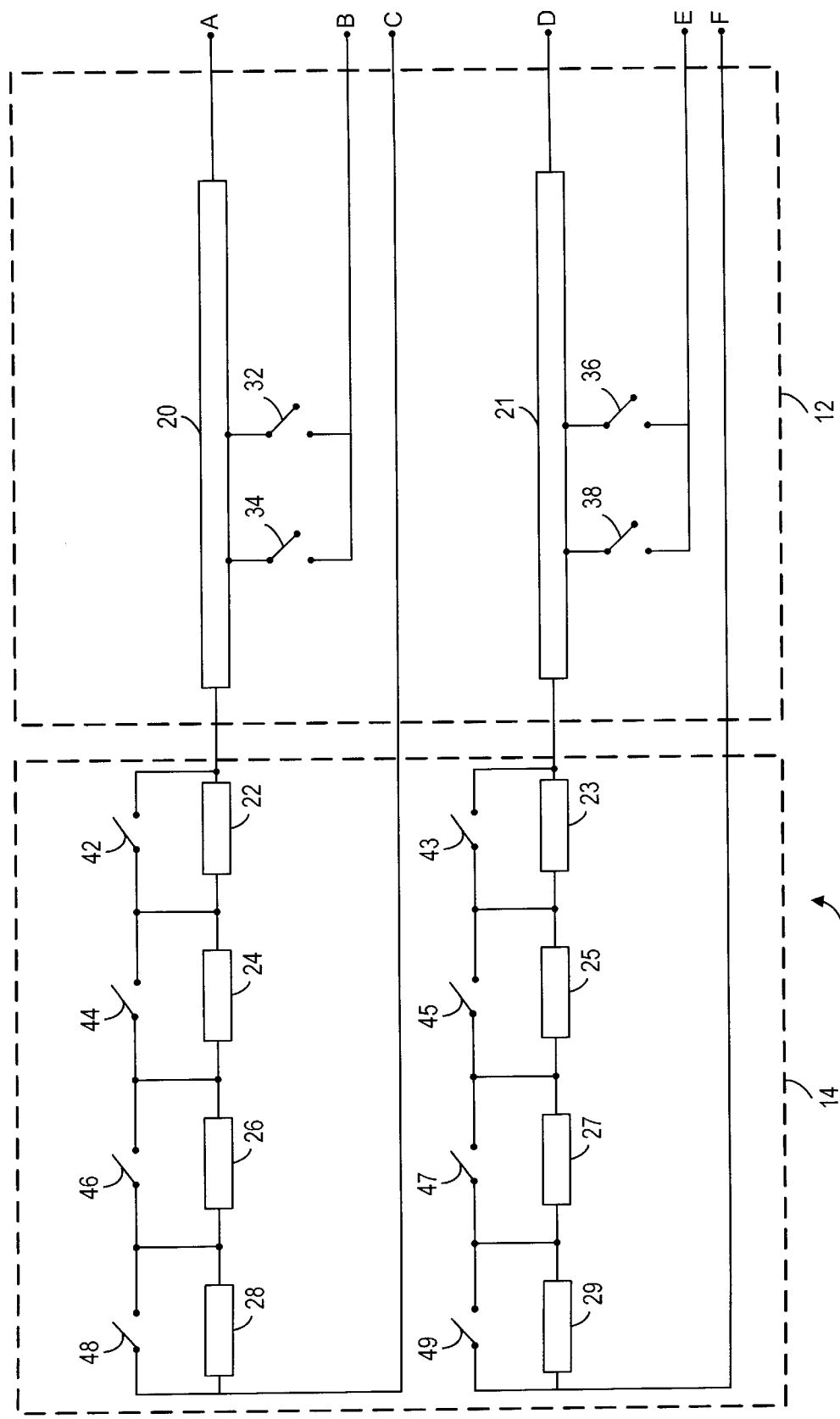
FIG. 6b is a diagrammatic representation illustrating yet another arrangement of the status keys in a keyboard, according to the present invention.

The present invention, as shown in FIGS. 3–4c, has described in conjunction with a key arrangement in the first section 12, in which a single resistive strip 20 is used to locate the pressed first key 32–36. However, the first section 12 can have two or more resistive strips, as shown in FIG. 2b. Furthermore, the resistive strip 20 can be replaced by a series of discrete resistors, as shown in FIGS. 1a–1b. Alternatively, the first switches 32–36 can be distributed among a plurality of resistive strips, wherein the resistive strips are not necessarily connected to each other. For example, as shown in FIG. 6a, the first switches 32 and 34 are connected to the resistive strip 20 and to the common point B, while the first switches 36 and 38 are connected to a separate resistive strip 21 and to another common point E. In this arrangement, the pressed second keys 42–48 can be identified by measuring the total impedance between point A and point C. Among the first keys 32–38, the pressed one can be identified by separately measuring the impedance between point A and point B, and the impedance between point D and point E. Thus, all of the first keys 32–38 can be used in combination with the second keys 42–48, although the first keys 36 and 38 are not electronically connected to the resistors 22–28. If more status keys are needed, it is possible to provide another series of second resistors 23–29 connected to the resistive strip 21 and another set of second switches 43–49 for selectively by-passing the second resistors 23–29, as shown in FIG. 6b. With the arrangement as shown in FIG. 6b, the pressed second keys 42–48 are identifiable by the total impedance between point A and point C, while the pressed keys 43–49 are identifiable by the total impedance between point D and point F. Among the first keys 32–38, the pressed one can be identified by separately measuring the impedance between point A and point B and the impedance between point D and point E. All of the first keys 32–38 can be used in combination with the second keys 42–48 and 43–49, although the resistors 22–28 are connected to the resistive strip 20, while the resistors are 23–29 are connected to the resistive strip 21. It should be noted that, in the arrangement, as shown in FIGS. 6a and 6b, it is preferable to connect point B to point E to reduce the number of I/O pins.

Figure 6C:
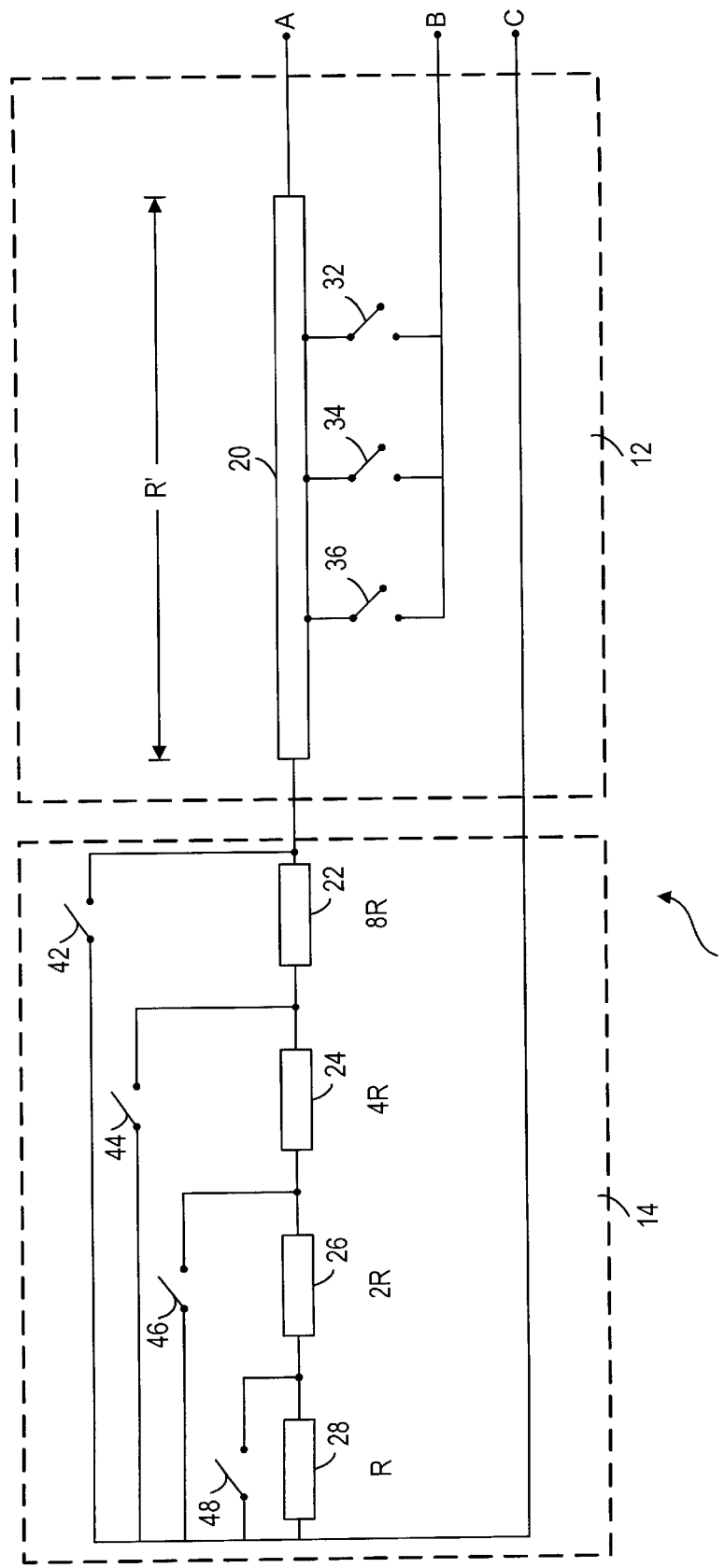
FIG. 6c is a diagrammatic representation illustrating a further arrangement of the status keys in a keyboard, according to the present invention.

The arrangement of the resistors 22–28 and the status keys 42–48, as illustrated in FIGS. 4a–4b and 6a is particularly useful when the status keys can be used singly (ALT alone, for example) or in combination (CTRL+ALT, for example). When the status keys are used separately without combination, it is possible to provide connections to the switches in a different way, as shown in FIG. 6c. As shown in FIG. 6c, one end of the second keys 42–48 is connected to the associated resistors 22–28, the other end of the second keys 42–48 is connected to a common point C. In this arrangement, when a second key is pressed, the total impedance between point A and point C is equal to sum of the resistance R' of the resistive strip 20 and all of the preceding resistors. For example, if the second key 46 is pressed, the total impedance between point A and point C is equal to R'+4R+8R. If the second key 44 is pressed, the total impedance is equal to R'+8R. It should be noted that, in the arrangement, as shown in FIG. 6c, it is possible to assign one or more keys to perform one or more combined functions. For example, it is possible to assign the second keys 42 and 44 to the functions of ALT+CTRL and ALT, respectively.

It should also be noted that the present invention, as described in conjunction with FIGS. 3, 4a–4c, and 6a–6c, can be implemented in an electronic device in different ways. For example, the switches for use as first and second keys can be of many different forms. They can be mechanical switches, touch-sensitive switches, toggle switches, momentary switches, and the like. The resistors can be discrete resistors to be soldered or attached onto a circuit board, but they can also be made from one or more thick-film materials, to be printed directly on the circuit board. Furthermore, the resistive strip can be replaced by discrete resistors or a combination of one or more resistive strips and one or more resistors.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A keyboard for entering information in an electronic device, comprising:

a plurality of first keys electronically connected to a series of first resistors at a plurality of locations for providing a first information in response to the activation of one of the first keys, wherein the first information is indicative of the location of the activated first key for identifying the activated first key;

a plurality of second resistors connected in series to the series of first resistors, wherein each second resistors has a different resistance; and a plurality of second keys separately connected in parallel to the second resistors for selectively by-passing the second resistors when one or more second keys are activated, wherein a second information is provided when one of the first keys is activated together with at least one second key, and wherein the second information is indicative of the resistance of said at least one activated second key for identifying said at least one activated second key.

2. The keyboard of claim 1, wherein the first resistors are provided in a form of one or more resistive strips.

3. The keyboard of claim 1, wherein the first resistors are provided in a form of discrete resistors.

4. The keyboard of claim 1, wherein the first resistors comprise at least one resistive strip and at least one discrete resistor.

5. The keyboard of claim 1, wherein the first keys include alphanumeric keys each representing a different alphanumeric value and the second keys include status keys for changing the alphanumeric value.

6. The keyboard of claim 5, wherein the status keys are assigned to perform single status functions for changing the alphanumeric value.

7. The keyboard of claim 5, wherein at least one status key is assigned to perform a combined status function for changing the alphanumeric value.

8. The keyboard of claim 1, wherein the first keys include function keys representing different keyboard functions and the second keys include status keys for changing the keyboard functions.

9. The keyboard of claim 1, wherein the second resistors are provided in a form of discrete components.

10. The keyboard of claim 1, wherein the second resistors are provided in a form of printed components on a circuit board.

11. The keyboard of claim 1, wherein the second resistors comprise at least one discrete resistor and at least one printed resistor.

12. A method of arranging a keyboard for entering information in an electronic device, comprising the steps of:

providing a plurality of first resistors connected in series;

providing a plurality of first keys electronically connected to said series of first resistors at a plurality of locations for providing a first information when at least one of the first keys is pressed, wherein the first information is indicative of the location of the pressed first key; and providing a plurality of second resistors connected in series to the series of first resistors, wherein each second resistor has a different resistance; and providing a plurality of second keys separately connected in parallel to the second resistors for selectively by-passing the second resistors when one or more second keys are pressed, wherein a second information is provided when one of the first keys is pressed together with at least one second key, and wherein the second information is indicative of the resistance associated with the at least one pressed second key.

13. The method of claim 12, wherein the first resistors include at least one discrete resistor.

14. The method of claim 12, wherein the first resistors include at least one resistive strip.

15. The method of claim 12, wherein the second resistors include discrete components.

16. The method of claim 12, wherein the second resistors include printed components on a circuit board.

17. The method of claim 12, wherein the first keys include alphanumeric keys representing different alphanumeric values and the second keys include status keys for changing the alphanumeric values.

18. The method of claim 12, wherein the first keys include function keys representing different keyboard functions and the second keys include status keys for changing the keyboard functions.

19. The method of claim 12, wherein each second resistor has two ends and each second key has two ends for separately connecting to the two ends of the resistors.

20. The method of claim 12, wherein each second key has a first end and a second end, wherein the first end is connected to a different second resistor and the second end is connected to a common point.

21. An electronic device comprising:

a keyboard for entering information, wherein the keyboard comprises:

a plurality of first keys electronically connected to a series of first resistors at a plurality of locations for providing a first information when one of the first keys is activated, wherein the first information is indicative of the location associated with the activated first key;

a plurality of second resistors connected in series to the series of first resistors, wherein each second resistor has a different resistance; and a plurality of second keys separately connected in parallel to the second resistors for selectively by-passing the second resistors when one or more second keys are activated, wherein a second information is provided when one of the first keys is activated together with at least one second key, and wherein the second information is indicative of the resistance of the at least one activated second key;

means, responsive to the first information and second information, for providing a third information indicative of the information entered via the pressed first and second keys, and means, responsive to the third information, for processing the entered information.

22. The electronic device of claim 21, further comprising means for displayed information based on the processed information.

23. The electronic device of claim 21, further comprising means for conveying the processed information to another electronic device based on the processed information.

* * * * *

UNITED STATES PATENT AND TRADEMARK OFFICE
CERTIFICATE OF CORRECTION

PATENT NO. : 6,639,523 B2
DATED : October 28, 2003
INVENTOR(S) : Kaikuranta et al.

It is certified that error appears in the above-identified patent and that said Letters Patent is hereby corrected as shown below:

<u>Title page,</u>
Item [56], References Cited, U.S. PATENT DOCUMENTS, please insert the following:

-- U.S. 4,583,189    4/1998    Koyama --
FOREIGN PATENT DOCUMENTS, insert -- GB 2 151 379 A   7/1985 --

<u>Column 1,</u>
Line 18, "$r_2/r_1$," should be -- $r_2/r_1$. --

Signed and Sealed this

Thirteenth Day of April, 2004

JON W. DUDAS
*Acting Director of the United States Patent and Trademark Office*